(12) United States Patent
Pio et al.

(10) Patent No.: US 6,278,163 B1
(45) Date of Patent: Aug. 21, 2001

(54) HV TRANSISTOR STRUCTURE AND CORRESPONDING MANUFACTURING METHOD

(75) Inventors: Federico Pio, Brugherio; Carlo Riva, Renate, both of (IT)

(73) Assignee: STMicroelctronics S.r.l., Agrate-Brianza (IT)

( * ) Notice: Subject to any disclaimer, the term of this patent is extended or adjusted under 35 U.S.C. 154(b) by 0 days.

(21) Appl. No.: 09/224,939

(22) Filed: Dec. 31, 1998

(30) Foreign Application Priority Data

Dec. 31, 1997 (EP) .................................... 97830744

(51) Int. Cl.[7] .................................. H01L 31/062
(52) U.S. Cl. .................... 257/408; 257/384; 257/754
(58) Field of Search ..................... 257/754–757, 257/392, 413, 382–385, 344, 408

(56) References Cited

U.S. PATENT DOCUMENTS

| 5,683,924 | * | 11/1997 | Chan et al. | 438/300 |
| 5,844,274 | * | 12/1998 | Tsutsumi | 257/333 |
| 5,914,518 | * | 6/1999 | Nguyen et al. | 257/377 |
| 5,945,710 | * | 8/1999 | Oda et al. | 257/344 |
| 5,945,738 | * | 8/1999 | Nguyen et al. | 257/756 |
| 5,949,105 | * | 9/1999 | Moslehi | 257/336 |

FOREIGN PATENT DOCUMENTS

| 0747941A2 | 12/1996 | (EP) . |
| 60117674 | 6/1985 | (JP) . |
| 01094666 | 4/1989 | (JP) . |

\* cited by examiner

*Primary Examiner*—Olik Chaudhuri
*Assistant Examiner*—Ginette Peralta
(74) *Attorney, Agent, or Firm*—Theodore E. Galanthay; Robert Iannucci; Seed IP Law Group PLLC (57) ABSTRACT

An HV transistor integrated in a semiconductor substrate with a first type of conductivity, comprising a gate region included between corresponding drain and source regions, and being of the type wherein at least said drain region is lightly doped with a second type of conductivity. The drain region comprises a contact region with the second type of conductivity but being more heavily doped, from which a contact pad extends.

6 Claims, 10 Drawing Sheets

HV TRANSISTOR STRUCTURE AND CORRESPONDING MANUFACTURING METHOD

TECHNICAL FIELD

This invention relates to an HV (High Voltage) transistor and corresponding manufacturing process, in particular in processes employing silicides.

More particularly, but not exclusively, the invention relates to an HV transistor for integration in the same substrate as other devices intended for operation on relatively high voltages, e.g., non-volatile memories of the EEPROM and Flash-EEPROM types, and devices which are to operate at high speeds, and the description that follows will cover this field of application for convenience of explanation.

BACKGROUND OF THE INVENTION

As is well known, to improve the speed of devices, the current technology for manufacturing semiconductor integrated circuits has succeeded in greatly reducing the resistance of interconnects and contacts of the individual devices, through the use of composite materials comprising silicon and a transition metal such as titanium or tungsten. These composite materials are termed silicides and used for forming layers with relatively low resistivity.

In particular, the formation of a silicide layer over the active areas of a MOS transistor comprises the following steps, subsequent to forming the transistor gate:

implanting first portions of the source and drain regions with dopant at a low concentration;

forming spacers adjacent to the gate and interconnect lines;

implanting second portions, comprised in the source and drain regions of the transistor, at a high concentration;

depositing a transition metal over the entire surface of the substrate;

applying a thermal process, whereby the transition metal reacts selectively with the substrate surface to yield silicide in areas not covered with dielectric.

By these process steps, the silicide deposition can be extended to also cover the polysilicon which constitutes the gates and interconnects of the transistor, since the etching steps for clearing the active areas of the oxide which overlies them have a similar effect on the interconnects formed of polysilicon lines.

However, silicide layers cannot be used in the fabrication of high voltage devices, especially HV (High Voltage) transistors of either the P-channel or the N-channel type formed by a DE (Drain Extension) technique. In these devices, the source and drain diffusions are lightly doped regions, so as to provide HV transistors with a sufficiently high breakdown voltage for operation on high bias and working voltages.

The process for producing silicide layers may develop problems on account of the light dopant concentration and small thickness of such regions. For example, during the thermal process for reacting the transition metal layer with the substrate surface, a surface layer of substrate is expended, and some dopant is taken up from the substrate by the silicide layer. Thus, in normal operation of the device, the silicide layer is shorted to the substrate.

Another problem with these high voltage transistors comes from the high strength electric fields which are created between the border of the active area of the transistor and the field oxide.

In addition, these high voltage transistors are often integrated in the same substrate as low voltage transistors. The low voltage transistors should have a short channel and have source and drain regions formed by implantations at a sufficient energy and dopant concentration to ensure retention of the source and drain regions after the formation of the silicide layer required to provide adequately fast performance of the low voltage transistors.

However, it is undesirable to increase the number of the implantations and masks used for differentiating the high voltage transistors from the low voltages ones.

SUMMARY OF THE INVENTION

An embodiment of this invention provides a high voltage transistor with such structural features as to prevent the onset of strong electric fields in the silicon border region between the field oxide and the active area of the transistor containing the source and drain regions.

Furthermore, it is an object of this invention to provide a process whereby the number of steps for simultaneously forming high and low voltage transistors can be minimized.

Specifically, the embodiment is directed to an HV transistor integrated in a semiconductor substrate having a first type of conductivity, which transistor has a gate region included between corresponding drain and source regions, with at least said drain region being lightly doped with a second type of conductivity.

The invention also relates to a process for manufacturing an HV transistor having a gate region included between corresponding drain and source regions, which process comprises a first step of implanting a first type of dopant at a low dopant concentration to form at least the drain region.

The embodiment further provides a high voltage transistor with contact pads effective to establish a direct contact with the source and drain regions.

A transistor according to the invention affords improved integration of high voltage transistors with devices formed of silicide layers, such as low voltage transistors.

A transistor according to the invention also allows the contact resistances to be reduced.

The features and advantages of the device according to the invention will be apparent from the following description of an embodiment thereof, given by way of non-limitative example with reference to the accompanying drawings.

DETAILED DESCRIPTION

Referring to the drawing views, generally shown at 2 is an HV (High Voltage) transistor integrated in a semiconductor substrate 1.

Reference will be made hereinafter to a preferred embodiment of devices of the N type. For devices of the P type, all the types of conductivities mentioned hereinafter should be reversed.

Figure 11:
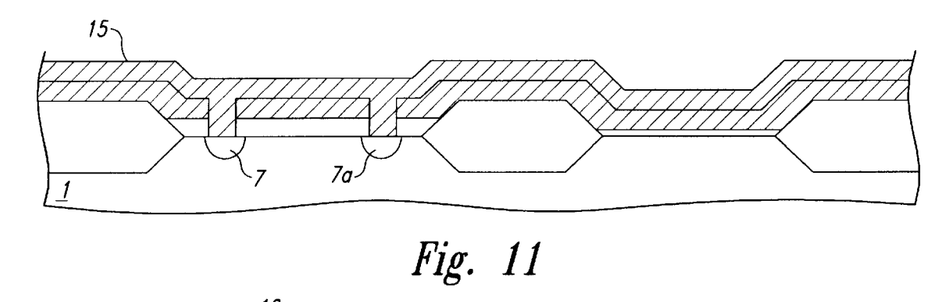

The HV transistor 2 has drain 16 and source 17 regions. The drain region 16 is formed by a first implantation of the N-type in the substrate I of the P type, while the source region 17 is formed by another implantation of the N type. Advantageously, the first implantation of the N-type also forms the source region 17. These regions 16, 17 are separated by a channel region containing a gate region 12 of polysilicon, which may consist of two overlapping layers 11, 15 of polysilicon short-circuited to each other (FIG. 11). This gate region 12 is isolated from the substrate 1 by an oxide layer 8a having a first thickness.

The drain 16 and source 17 further comprise a respective contact regions 7, 7a formed by an implantation of the N+ type.

In particular, each contact region 7, 7a is comprised between two lightly doped regions 16a, 16b and 17a, 17b, respectively.

A respective contact pad 21, 21a is provided on each contact region 7, 7a.

In particular, these contact pads 21, 21a are formed with the second polysilicon layer 15 and defined during the same process step as the gate 12 of the HV transistor 2.

These contact pads 21, 21a are in direct contact with respective contact regions 7, 7a and extend from the substrate 1 surface, being advantageously self-aligned thereto.

Figure 21:
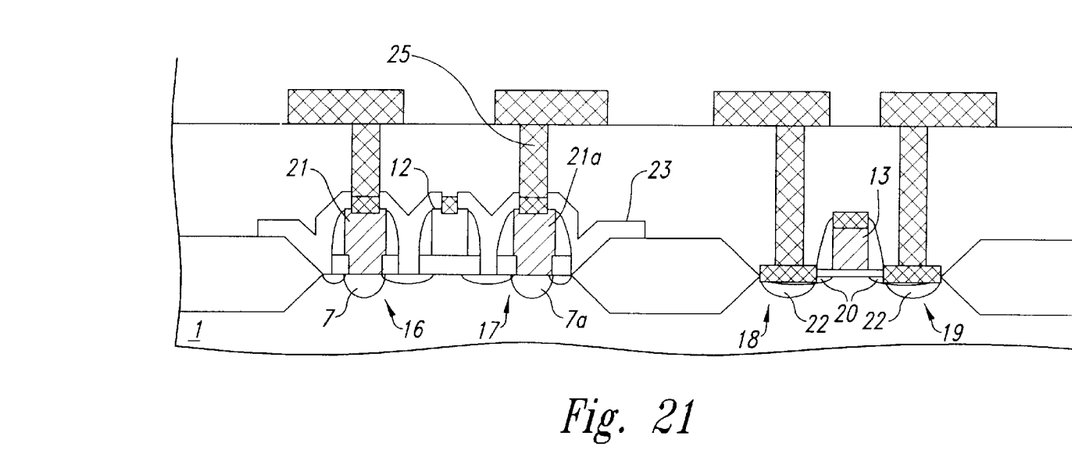
FIG. 21 is a sectional view of the high voltage transistor shown in FIG. 20, taken along line XXI—XXI.

Advantageously, at least one of the drain 16 and source 17 pads 21, 21a, and optionally the gate region 12 of the HV transistor 2, comprise a silicide layer 25, as shown in FIG. 21.

Preferably, these HV transistors 2 can be incorporated to the circuitry of non-volatile memory cells conventionally comprising LV (Low Voltage) transistors 3.

Each LV transistor 3, of known type, has respective drain 18 and source 19 regions. Each region 18, 19 comprises a first portion 20 formed by the first implantation of the N-type in the substrate 1, and a second portion 22 formed by a second implantation of the N+ type, such that the second portion 22 is out of alignment to the gate 13 of the same LV transistor 3.

Figure 4:
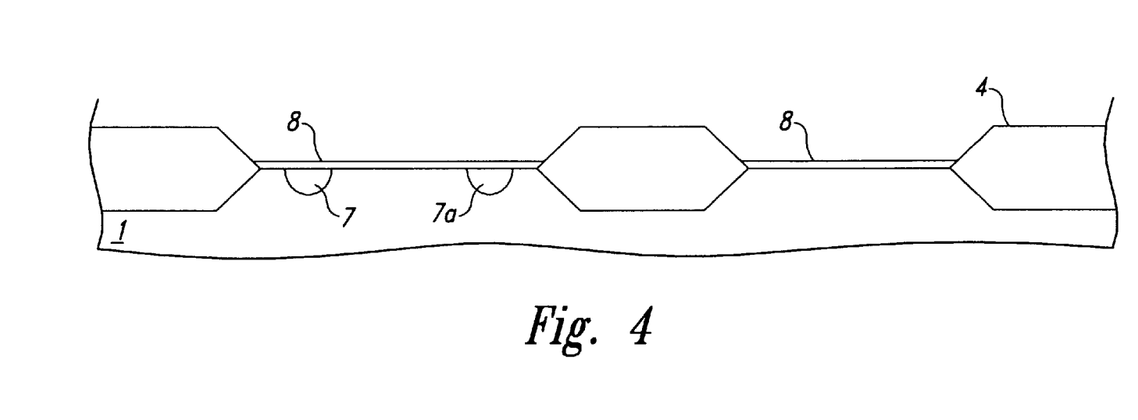

This gate region 13 of polysilicon may comprise two overlapping layers 11, 15 of polysilicon short-circuited to each other, and is isolated from the substrate 1 by another oxide layer 10, thinner than the oxide layer 8a (FIG. 4). The gate region 13 further comprises a silicide layer 25.

The silicide layer 25 also covers the second portions of the drain 18 and source 19 regions.

Advantageously, spacers 5a of a dielectric material are formed at either sides of the gates 12 and 13 of the transistors 2 and 3.

Preferably, these spacers are also provided at the opposite sides of the polysilicon pads 21, 21a.

Referring to FIGS. 3 to 14, the process of an embodiment of this invention for manufacturing the HV transistor 2 comprises a step of selectively forming, over the surface of the substrate 1, a first layer of field oxide 4 having a first thickness, so as to define respective first 5 and second 6 active areas of the transistors 2, 3.

Figure 1:
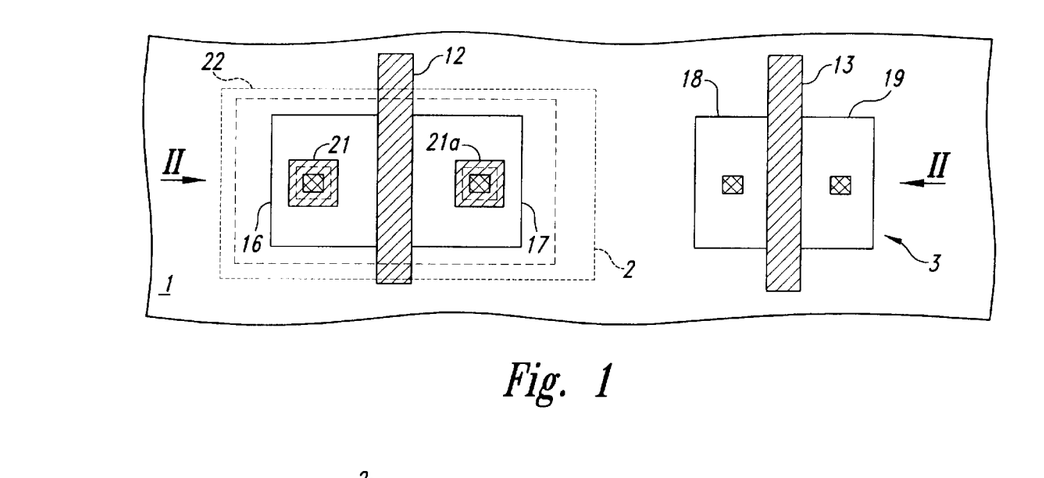
FIG. 1 is a top plan view of a high voltage transistor according to the invention.
Figure 2:
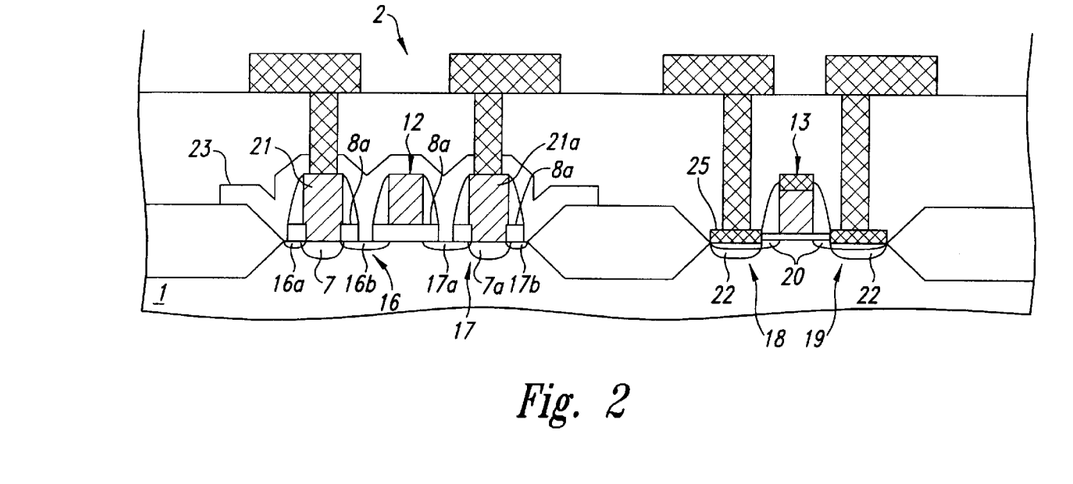
FIG. 2 is a sectional view of the high voltage transistor shown in FIG. 1, taken along line II—II.
Figure 3:
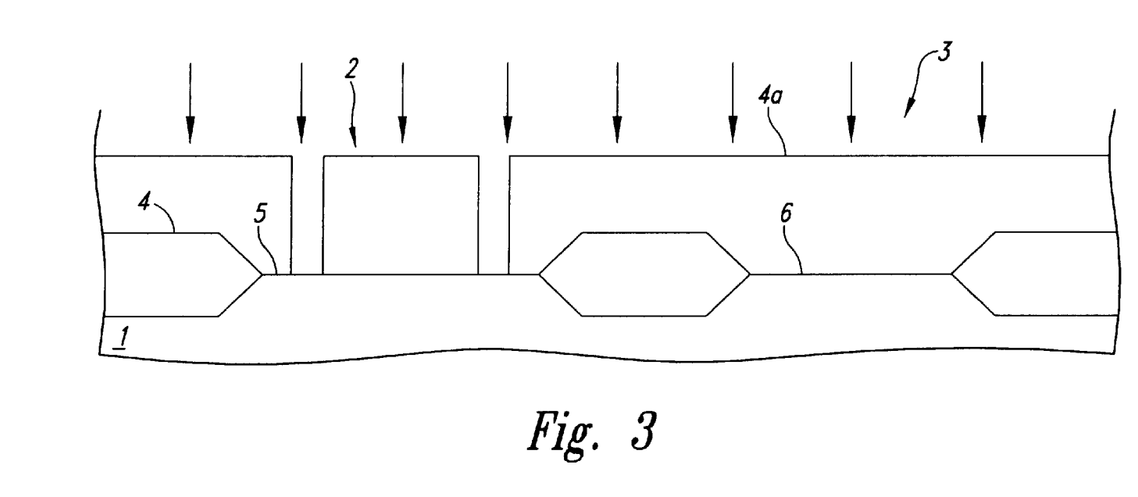
FIGS. 3 to 19 illustrate process steps for manufacturing the high voltage transistor of FIG. 1.

Thereafter, a resist layer 4a is formed selectively to define areas for regions which accommodate capacitors formed in the memory cell. Also defined are the areas for the contact regions 7, 7a of the HV transistor 2, as shown in FIG. 3.

A first implantation of the N+ type is carried out to form the capacitor regions in the memory cell and the contact regions 7, 7a.

A second oxide layer 8 having a second thickness is formed over the active areas 5, 6 (FIG. 4).

Figure 5:
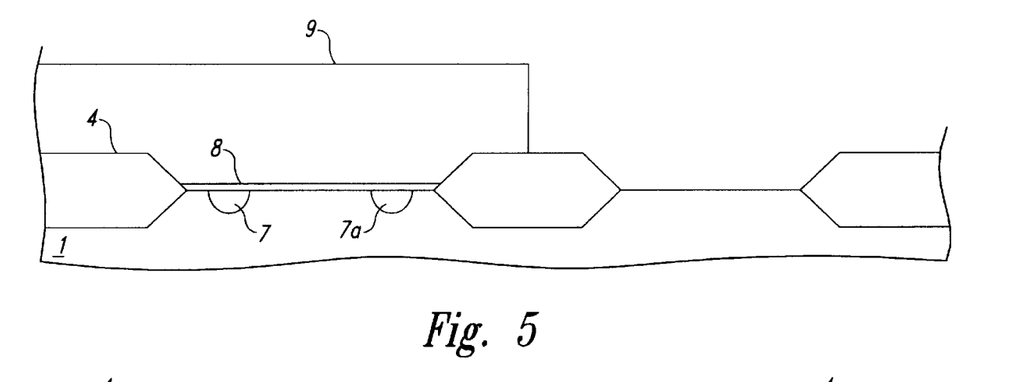

This layer 8 is then removed selectively from the active region 6 by a photolithographic process using a first mask 9 (FIG. 5).

Figure 6:
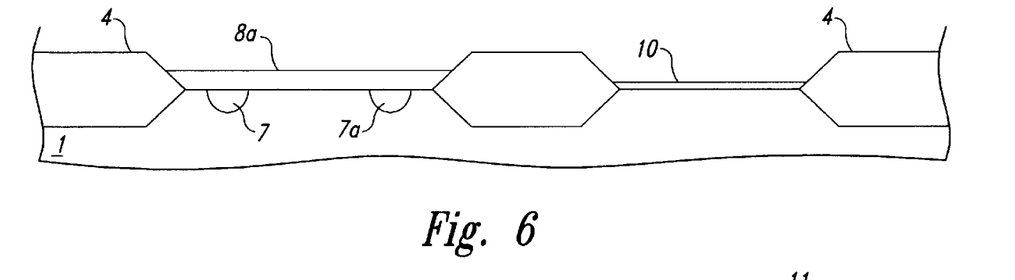

A third oxide layer 10, preferably thinner than the second layer 8, is then formed over the entire surface of the substrate 1. In this way, a layer 8a of oxide is formed over the active area 5 which is thicker than the layer 10, thereby to provide the gate oxide of the HV transistor 2 (FIG. 6).

Figure 7:
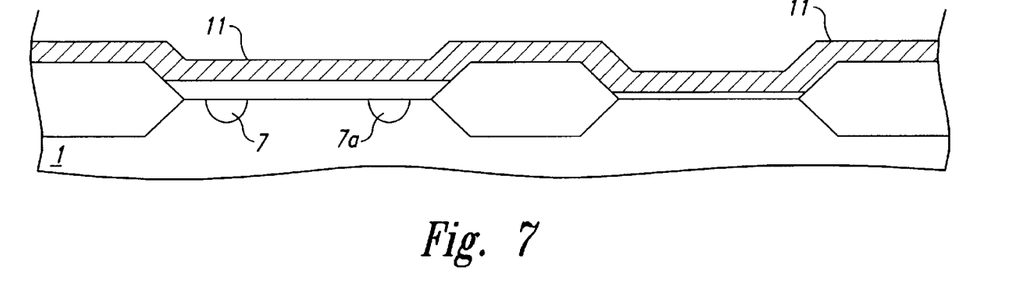
Figure 8:
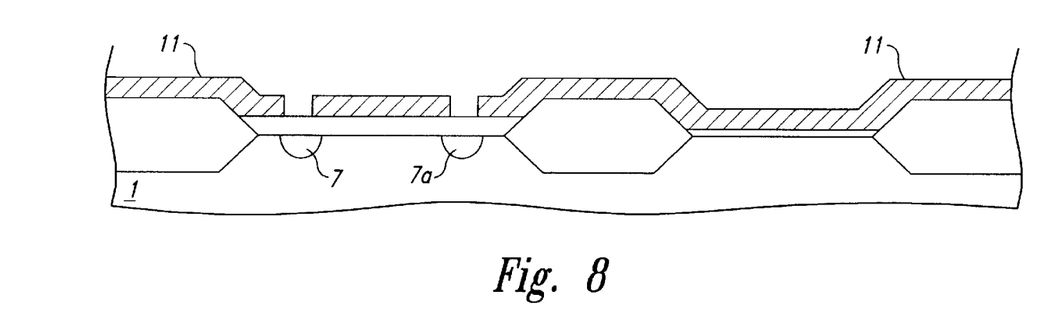
Figure 9:
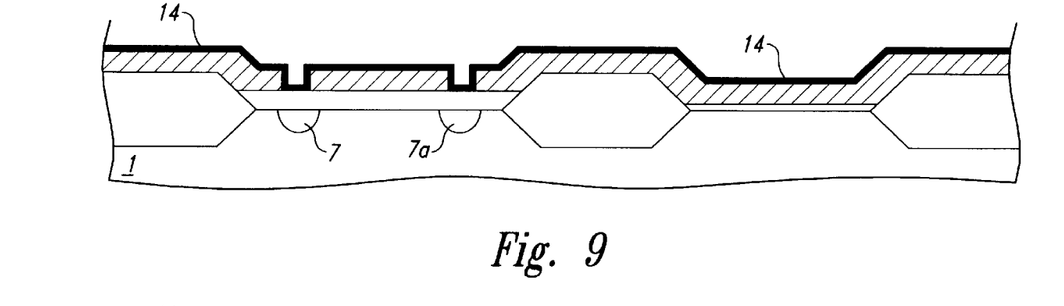

Subsequently, a first layer 11 of polysilicon is deposited, and then removed selectively. This layer is left over the channel region to produce floating gate regions in memory cells (not shown) and a first layer of the respective gate regions 12, 13 of the transistors 2, 3. The polysilicon layer 11 is also removed from the areas of the contact regions 7, 7a of the HV transistor 2 (FIGS. 7 and 8).

At this stage, if the contact regions 7, 7a have not been formed by the first implantation of the N+ type, an N+ implantation is presently carried out to provide them.

Figure 10:
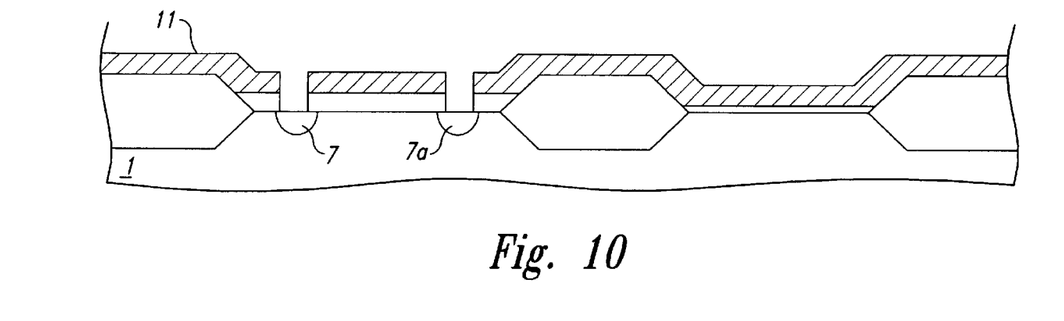

Subsequently, a fourth layer 14 of intermediate dielectric is formed over the whole surface of the substrate 1 (FIG. 9) to form the memory cells. This layer 14 is removed selectively from that portion of the circuitry which contains HV and LV transistors 2 and 3. This removal also clears the substrate 1 surface at the areas of the contact regions 7, 7a (FIG. 10).

A blanket implantation may now be carried out to form the contact regions 7, 7a, if not formed previously. The implant does not affect the memory cells.

Figure 12:
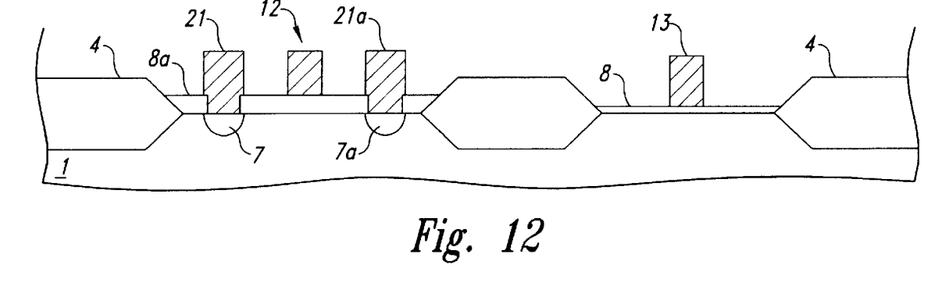

A second layer 15 of polysilicon is then deposited (FIG. 11), and removed selectively to define control gate regions in the memory cells, interconnects, pads 21, 21a, and gates 12, 13 of the HV 2 and LV 3 transistors (FIG. 12).

Advantageously, the photolithographic process used for defining the contact pads 21, 21a should provide for the use of a mask having misalignment tolerance only with respect to the mask previously employed for removing the first polysilicon layer 11.

Figure 13:
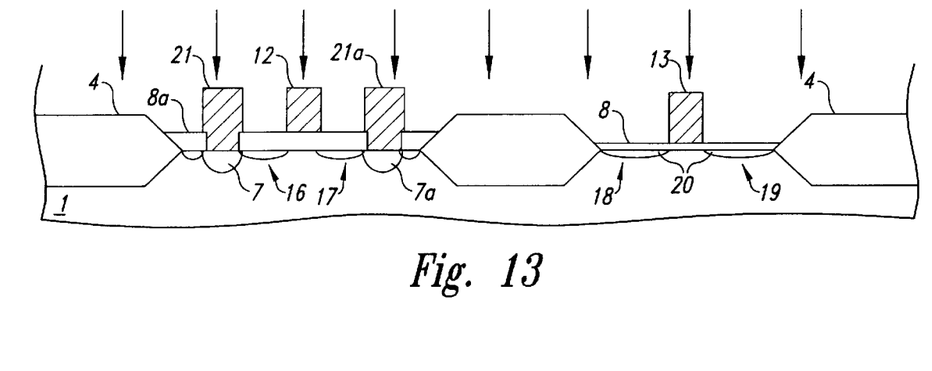

Thereafter, a first implantation of the N-type is carried out to form the drain 16 and source 17 regions of the HV transistor 2 and the first portions 20 of the drain 18 and source 19 regions of the LV transistor 3 (FIG. 13).

Figure 14:
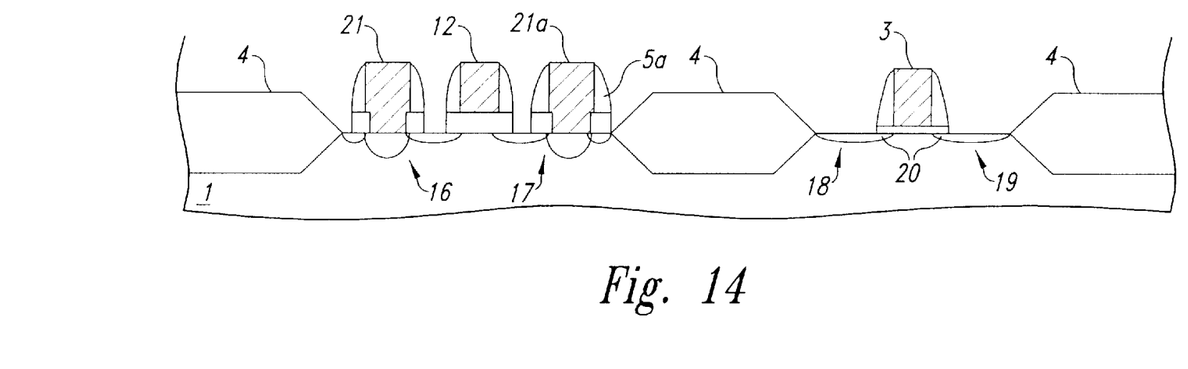

The spacers 5a of dielectric material are then formed, using conventional techniques, at either sides of respective gates 12, 13 of the transistors 2, 3, and on the contact pads 21, 21a, as shown in FIG. 14.

A layer 22' of resist is subsequently formed over the active area 5 of the HV transistor 2.

Figure 15:
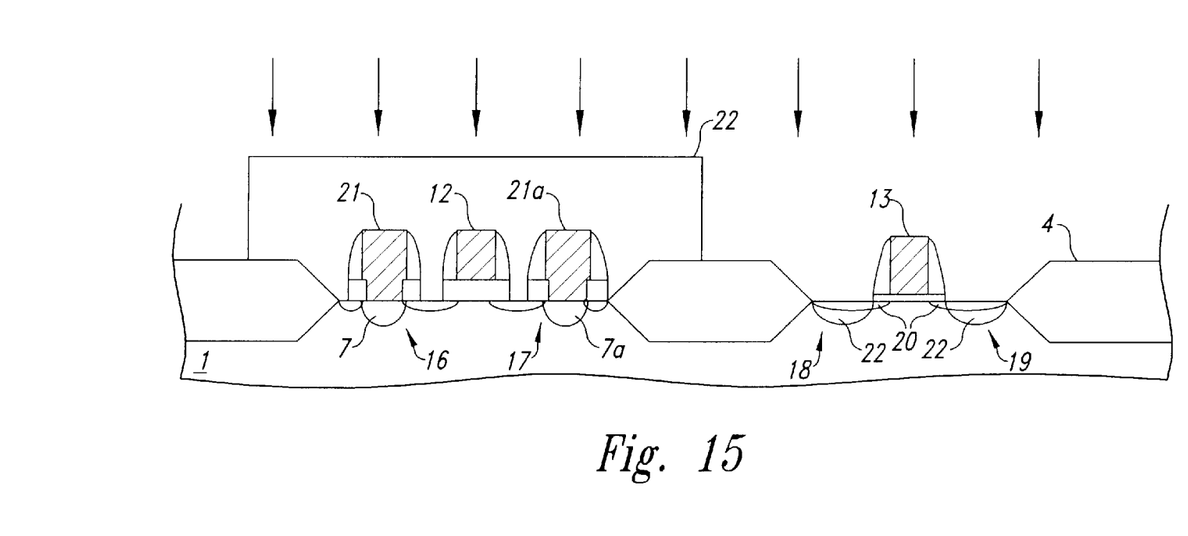

A second implantation of the N+ type is effected next to form the second portions 22 of the source 19 and drain 18 regions of the LV transistor 3 (FIG. 15).

This is followed by the formation of a fifth dielectric layer 23 over the entire surface of the substrate 1.

This layer 23 is then removed selectively from the active area 6 of the LV transistor 3.

Figure 16:
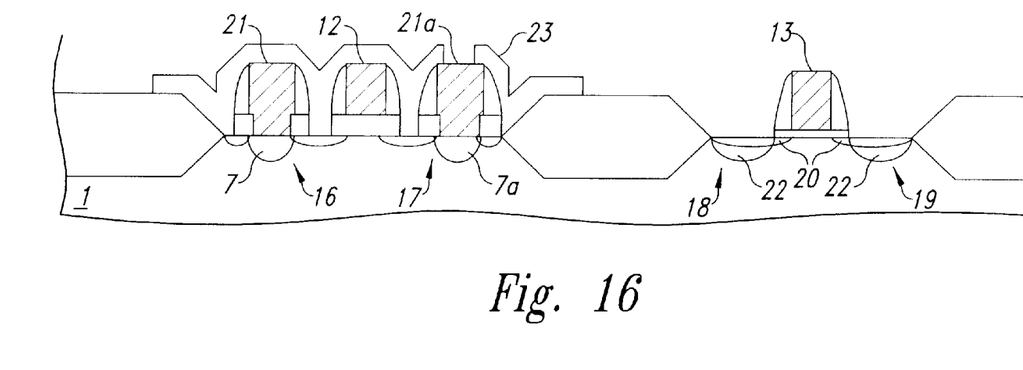

Advantageously, the dielectric layer 23 is also removed from the pad 21a of the source region 17 of the HV transistor 2 (FIG. 16).

Figure 22:
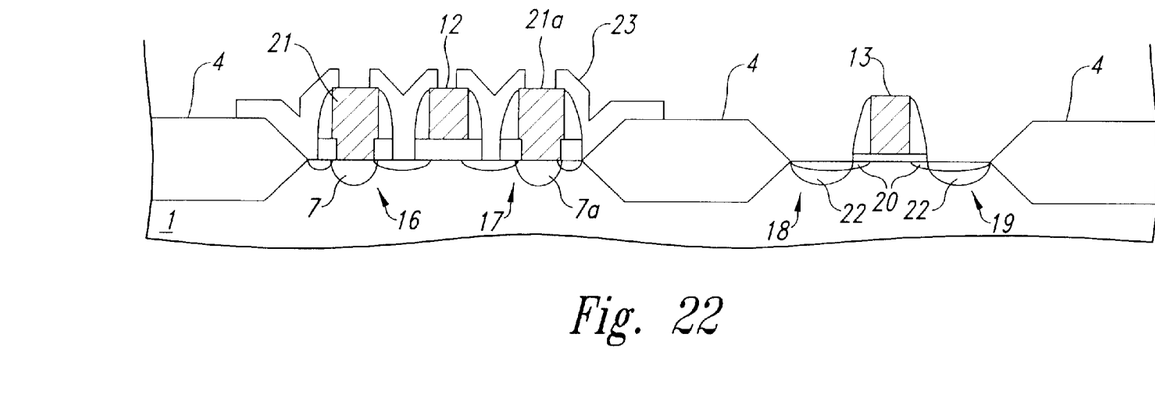
FIGS. 22 and 23 illustrate some of the process steps for manufacturing the high voltage transistor shown in FIG. 20.

Advantageously, this dielectric layer 23 is removed from the gate region 12 and the pad 21 of the drain region 16 (FIG. 22).

Figure 17:
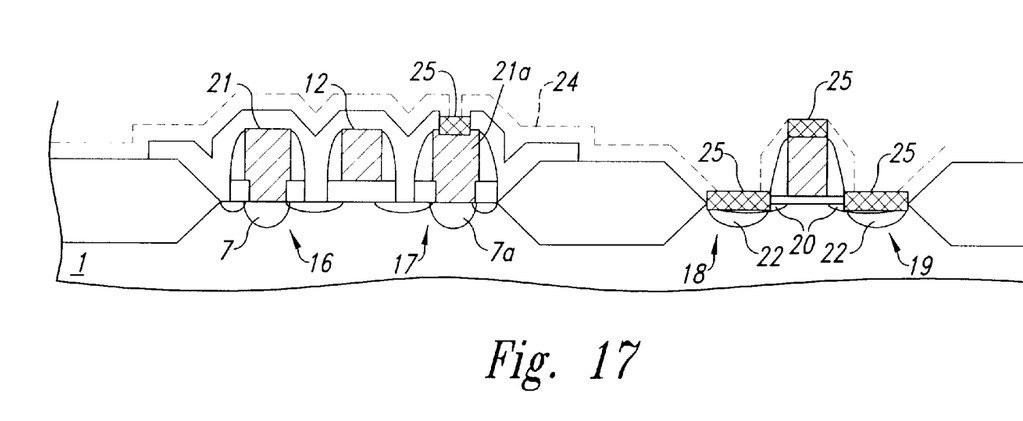
Figure 23:
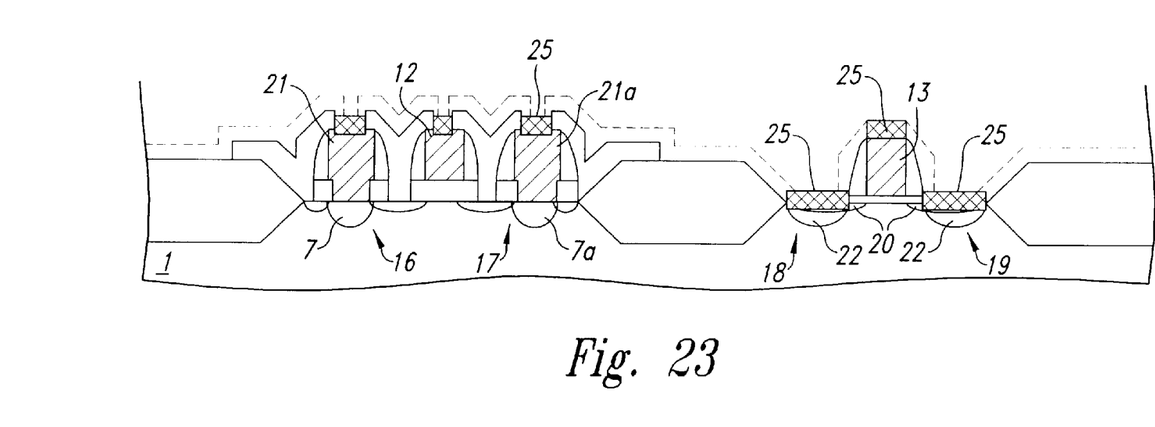

The process goes on with the formation of a metal layer 24 over the whole substrate surface. A thermal treatment is then applied to react the metal layer 24 with the surface of the substrate 1 and the polysilicon layers uncovered with dielectric, to produce a silicide layer 25 (FIGS. 17 and 23).

During the thermal treatment, the transition metal 24 only reacts with that portion of the substrate 1 which has no oxide layer thereon. The gate region 13 and the second portions of the drain 18 and source 19 regions of the LV transistor 3, and optionally the gate regions 12 and pad 21, 21a of the HV transistor 2, are thus covered with a layer having a relatively low resistance.

Figure 18:
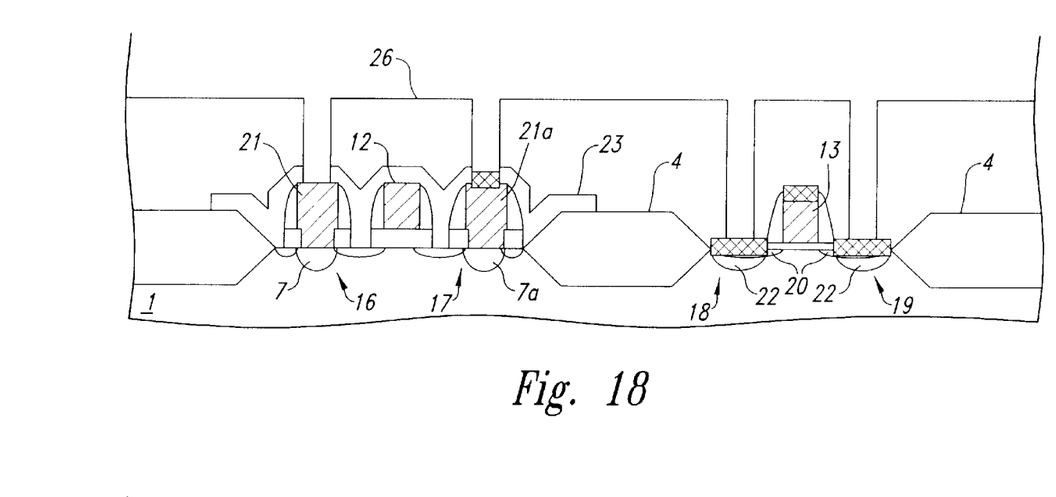

A sixth layer 26 of intermediate dielectric is formed, and then removed selectively to define the contact areas in the drain 16, 18 and source 17, 19 regions of the transistors 2, 3 (FIG. 18).

Figure 19:
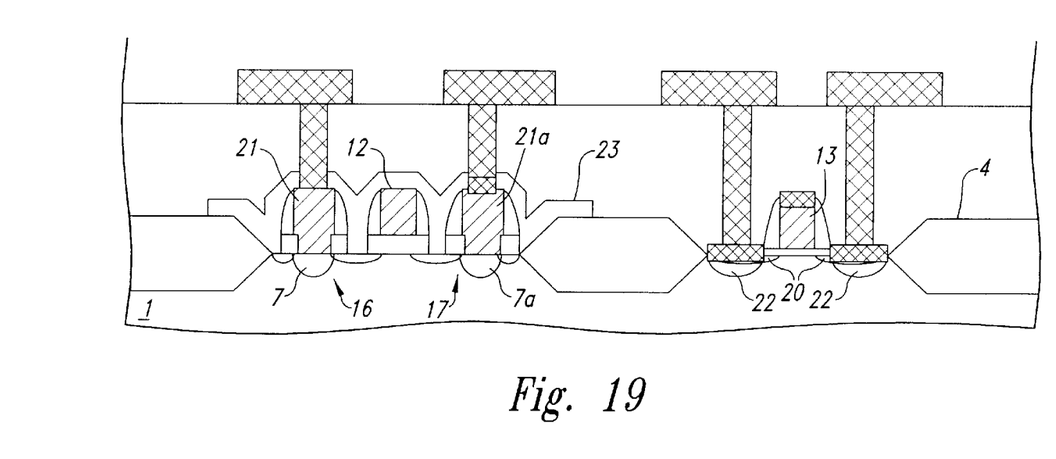
Figure 20:
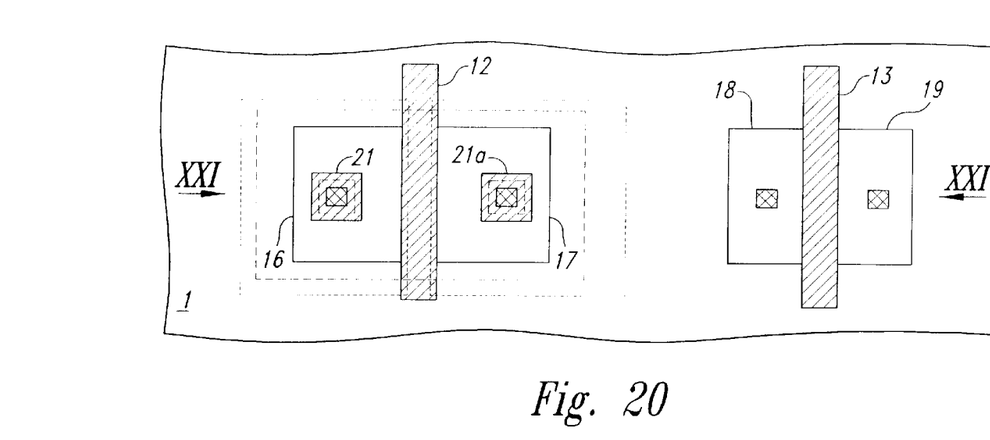
FIG. 20 is a top plan view of a second embodiment of the high voltage transistor according to the invention.

The process for making the contacts, and subsequent steps, are then completed with conventional techniques (FIG. 19).

Advantageously the process of this invention avoids the simultaneous formation of contacts on the silicide and silicon layers in the same device, thereby simplifying the contact etching and cleaning technology. In this way, the contact resistance of the silicon layer will not be increased as a result of the remove steps required to produce a good contact on the silicide layer.

In the process of this invention, the size of the contact regions is unrelated to the size of the contact areas dictated by the contact area filling technology.

The process just described concerns transistors formed in the circuitry of Flotox EEPROM cells; however, the process of this invention may also be implemented by omitting those process steps which are specific to this memory type.

As said before, this description covers the fabrication of N-channel HV, and optionally LV, transistors. Integrated circuits produced with conventional CMOS processes have circuitry portions which comprise N-channel devices with portions containing P-type transistors associated therewith.

The process of this invention for making the portion of the structure relating to N-channel and P-channel transistors in the same substrate would be implemented by adding process steps for making the CMOS structures to those previously described.

Two modifications are possible for forming P+ contact regions of the P-type high voltage transistors without increasing the number of masks required for manufacturing transistors with a single type of conductivity.

In a first modification, the N+ type implantation for forming the contact regions 7, 7a of the N-type HV transistors is carried out in the same phase in which the regions which contain capacitors of the N+ type for the memory cells are carried out. The contact regions of the P-type HV transistors are formed by an implantation of the P+ type which is carried out after removing the first polysilicon layer 11. To define these contact regions of the P+ type, the same mask is used as for removing this first polysilicon layer, thereby making a dedicated mask unnecessary.

In the second modification, the N+ type implantation of the contact regions 7, 7a of the N-type transistors is carried out simultaneously with the regions that contain capacitors of the N+ type for the memory cells. The contact regions of the P-type transistors are formed by a blanket implantation of the P+ type, following removal of the intermediate dielectric layer 14 from the circuitry.

This embodiment has an additional advantage in that it allows for a P-type implantation in the first polysilicon layer 11 to at least in part compensate for the N-type implantation which is carried out in the polysilicon layers of the memory cells to ensure proper operation of the memory cells.

The process of this invention does obviate the shortcomings involved in the simultaneous formation of HV and LV transistors. In fact, LV transistors should have a short channel, and this feature is inconsistent with the formation of the drain and source regions of LV transistors by an N- or P-implantation at a sufficiently high energy to ensure that such regions are retained after the silicidation process directed to improve the speed of LV transistors, as done in the prior art. Accordingly, additional process steps must be provided to form more heavily doped drain and source regions, which makes the whole sequence a fairly complicated one.

In the process of this invention, the number of masks and N and P implantations required to differentiate between HV and LV transistors is advantageously minimized.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A high voltage transistor, comprising:
   a semiconductor substrate of a first conductivity type;
   a gate region in the substrate;
   a gate contact pad extending from the gate region;
   first and second terminal regions on opposite sides of the gate region in the substrate, the first and second terminal regions each including a lightly doped section of a second conductivity type, the first terminal region also including a contact section that is more heavily doped of the second conductivity type than the lightly doped section of the first terminal region; and
   a first contact pad contacting and extending from the contact section, the contact pad being insulated on opposite sides by respective first and second insulating spacers that are laterally spaced from respective third and fourth insulating spacers positioned on opposite sides of the gate contact pad.

2. The high voltage transistor of claim 1 wherein the second terminal region also includes a contact section that is more heavily doped of the second conductivity type than the lightly doped section of the second terminal region.

3. The high voltage transistor of claim 1 wherein the first contact pad includes a main section formed of a semiconductor material and a connection layer formed of a reaction between the semiconductor material and a metal layer.

4. The high voltage transistor of claim 3 wherein the semiconductor material of the main section of the first contact pad is polysilicon and the connection layer is formed of a silicide.

5. The high voltage transistor of claim 1, further comprising a second contact pad extending from the second terminal region, the first, second, and gate contact pads all extending to substantially a same height from the substrate.

6. The high voltage transistor of claim 1, further comprising a gate contact pad extending from the gate region and a second contact pad extending from the second terminal region, each of the contact pads including a silicide layer at an end of the contact pad away from the substrate.

* * * * *